(12) United States Patent
Bracchitta et al.

(10) Patent No.: US 6,420,746 B1
(45) Date of Patent: Jul. 16, 2002

(54) THREE DEVICE DRAM CELL WITH INTEGRATED CAPACITOR AND LOCAL INTERCONNECT

(75) Inventors: John A. Bracchitta, South Burlington; Randy W. Mann, Jericho; Jeffrey H. Oppold, Richmond, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/182,857

(22) Filed: Oct. 29, 1998

(51) Int. Cl.[7] .................. H01L 27/108; H01L 29/76; H01L 31/119; H01L 29/00
(52) U.S. Cl. .................. 257/296; 257/306; 257/532
(58) Field of Search .................. 257/300, 306, 257/309, 311, 296, 532; 438/238, 239; 365/187

(56) References Cited

U.S. PATENT DOCUMENTS

| | | |
|---|---|---|
| 3,383,570 A | 5/1968 | Lüscher |
| 3,699,544 A | 10/1972 | Joynson et al. |
| 3,765,000 A | 10/1973 | Regitz |
| 3,851,313 A | 11/1974 | Chang |
| 3,852,800 A * | 12/1974 | Ohwada et al. ............. 257/306 |
| 3,876,991 A | 4/1975 | Nelson et al. |
| 4,016,551 A | 4/1977 | Carberry |
| 4,084,108 A | 4/1978 | Fujimoto |
| 4,460,911 A * | 7/1984 | Salters ........................ 257/306 |
| 4,633,438 A | 12/1986 | Kume et al. |
| 4,803,664 A | 2/1989 | Itoh |
| 4,929,989 A * | 5/1990 | Hayano ...................... 257/296 |
| 4,935,896 A | 6/1990 | Matsumura et al. |
| 5,146,300 A | 9/1992 | Hamamoto et al. |
| 5,463,234 A | 10/1995 | Toriumi et al. |
| 5,572,461 A | 11/1996 | Gonzalez |
| 5,646,903 A * | 7/1997 | Johnson ................. 365/230.05 |
| 5,744,835 A * | 4/1998 | Inoue ......................... 257/336 |
| 5,973,381 A * | 10/1999 | Kudo et al. ................ 257/532 |

* cited by examiner

Primary Examiner—Steven Loke
Assistant Examiner—Shouxiang Hu
(74) Attorney, Agent, or Firm—Mark F. Chadurjian; Eugene I. Shkurko

(57) ABSTRACT

A semiconductor integrated circuit memory cell, including at least three transistors and a capacitor to form a DRAM. The memory cell is fabricated on a semiconductor substrate including impurity regions, and using two semiconductor films, with dielectric films between the semiconductor films. The capacitor contains two electrodes. A substrate impurity region forms one of the electrodes; the other electrode is a semiconductor film which connects the gate of one device to an impurity region of another. The method for manufacturing the above-described integrated circuit, which may be used for the manufacture of similar circuits, is also disclosed.

16 Claims, 8 Drawing Sheets

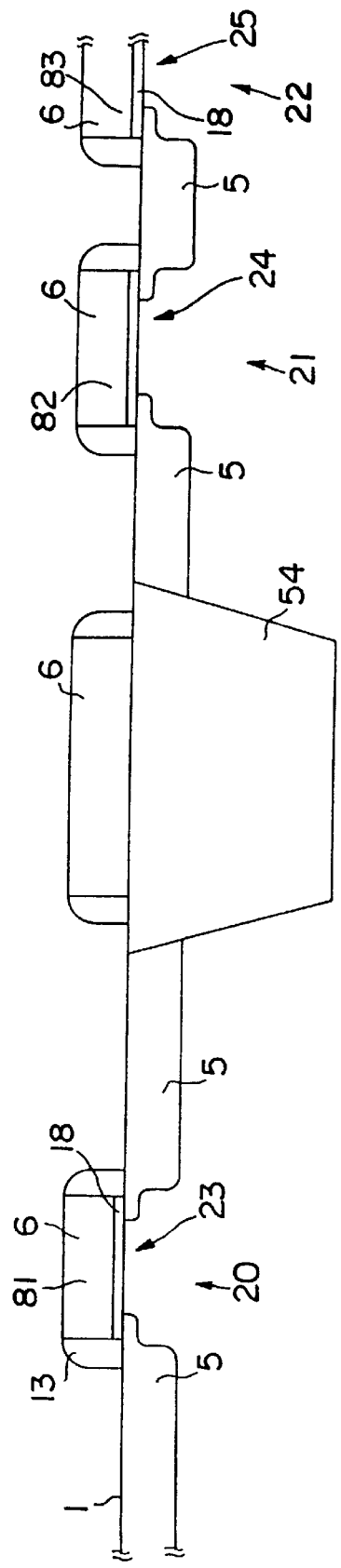
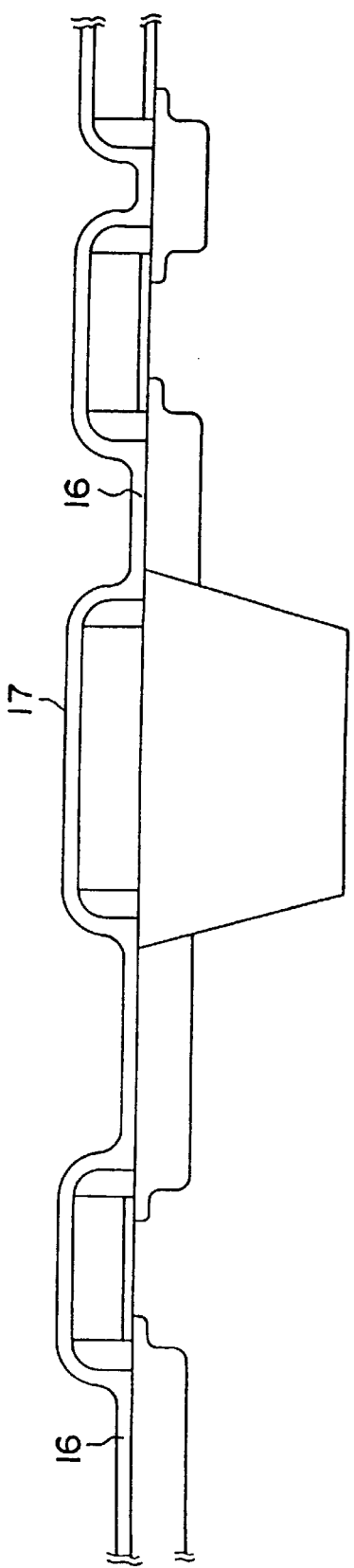
FIG. 5A
FIG. 5B

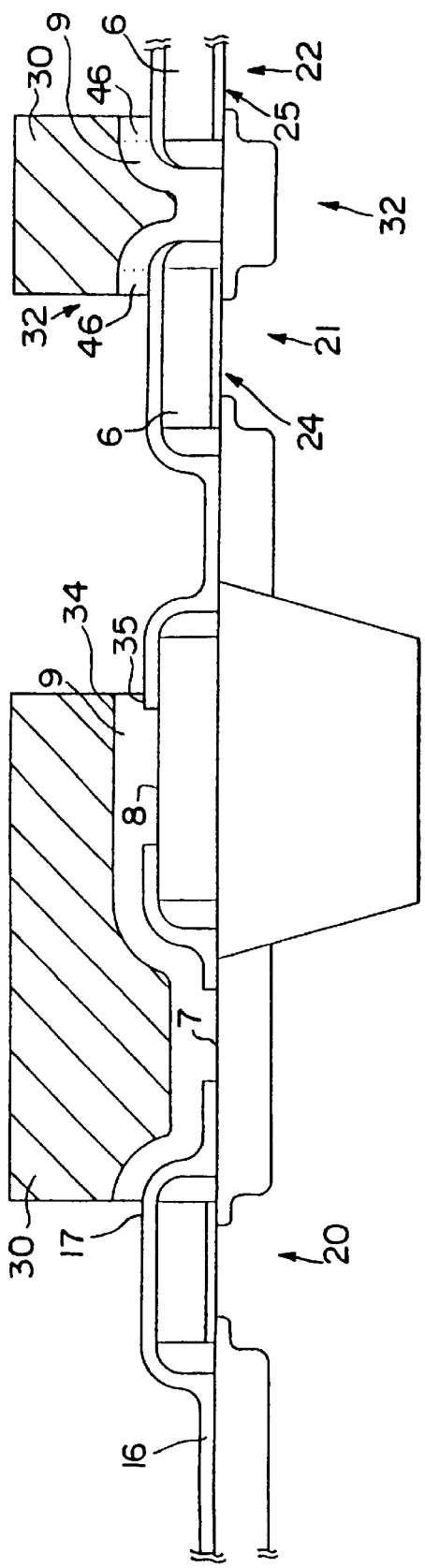
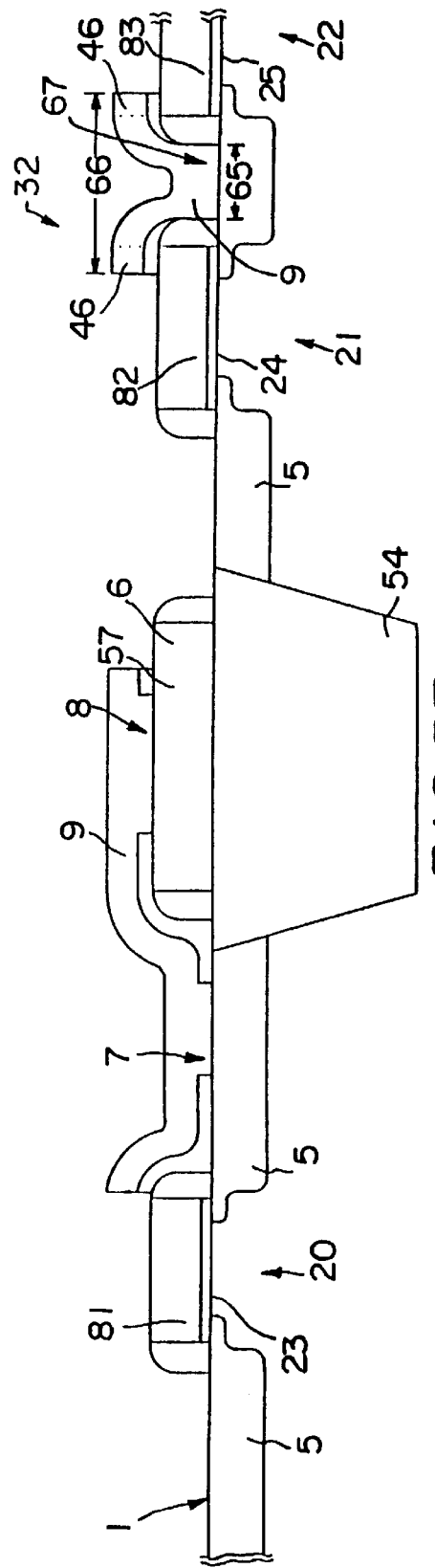

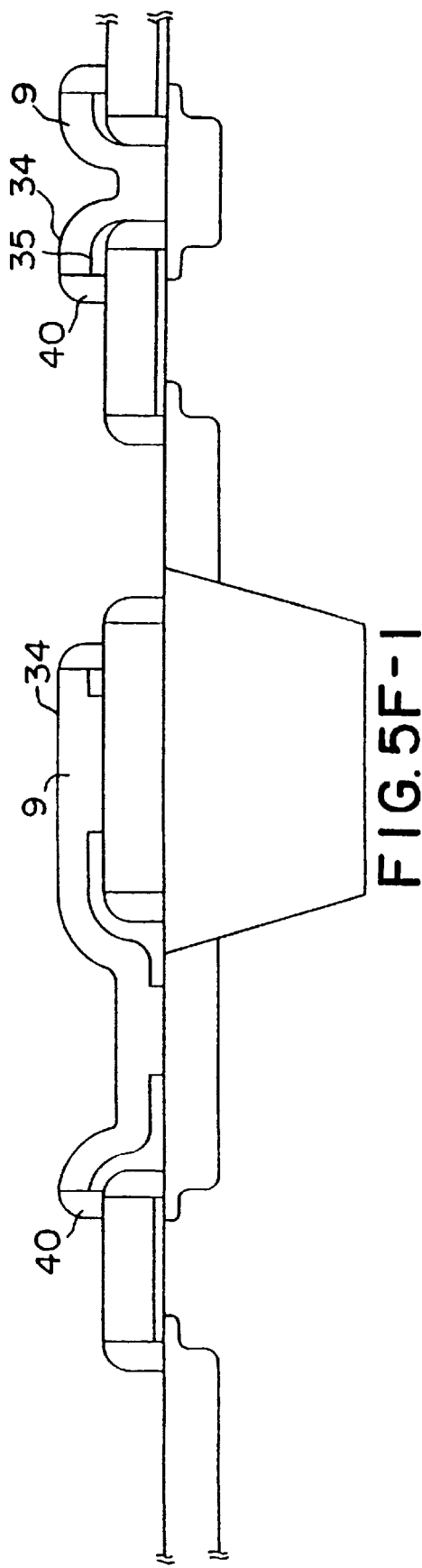

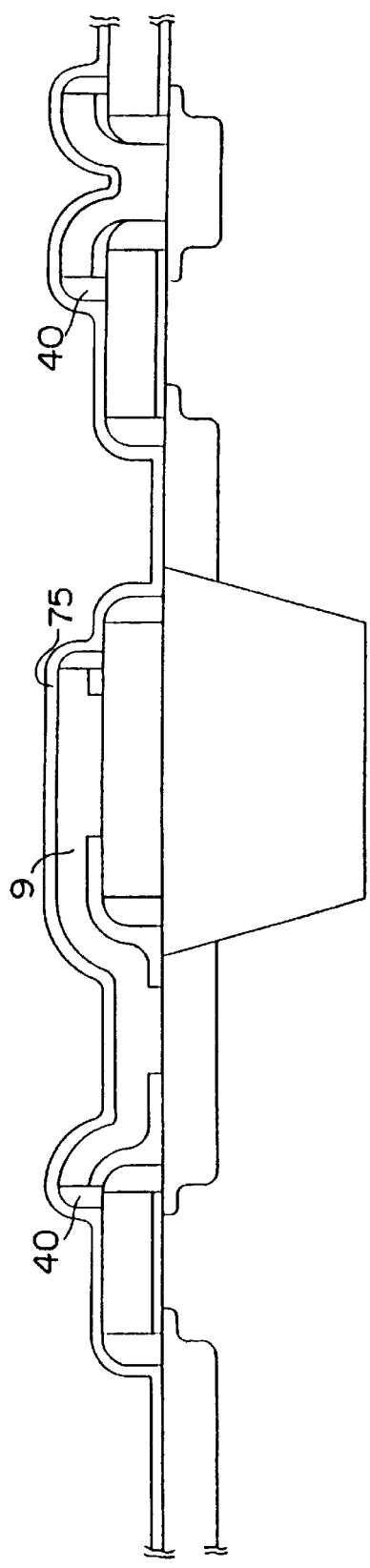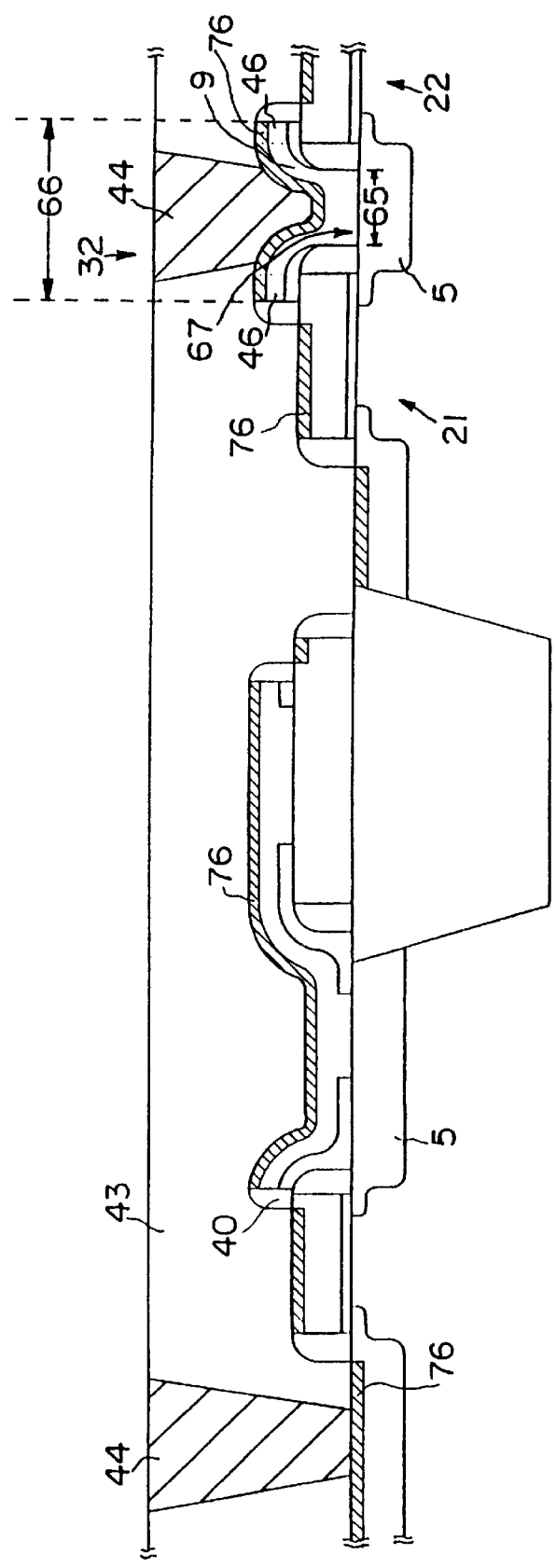

THREE DEVICE DRAM CELL WITH INTEGRATED CAPACITOR AND LOCAL INTERCONNECT

BACKGROUND OF THE INVENTION

The present invention relates generally to semiconductor integrated circuit devices. More particularly, the present invention relates to integrated circuit devices containing both memory and logic on the same integrated circuit, and also to the methods for manufacturing such integrated circuit devices.

DESCRIPTION OF THE RELATED ART

It is generally desirable in chip fabrication to provide both logic and memory circuitry on the same integrated circuit chip. An example of such memory circuitry is a dynamic random access memory (DRAM) device. A three device cell DRAM is not very attractive for stand alone memory applications due to area requirements. However, for embedded applications, the three device cell provides an attractive approach because of process integration considerations. DRAMs offer the advantage of increased memory for device size. For example, they are favored over static random access memory (SRAM) devices because SRAMs require a relatively large number of transistors. In contrast, DRAMs require less space. The drawback of DRAM technology is, however, that DRAM devices (unlike SRAMs) require periodic replenishment of the charge in their circuitry to function as memory devices. DRAMs store memory in the form of charge stored on a capacitor. The stored charge is prone to leakage and other forms of dissipation and, therefore, must be replenished on a regular basis. The amount of charge stored for a given capacitor is proportional to the size of the electrodes which form the capacitor.

Modern technology has developed VLSI (very-large-scale integration) procedures for device design and manufacture. As technology progresses, the ability to reliably and repeatably produce increasingly smaller device features increases. Device sizes shrink, which results in more devices for a given substrate size, which increases cost efficiency, because the cost of a substrate and the cost to process a substrate through a process operation is fixed. Another advantage of the advancing miniaturization is that more memory can be built into a device of a given size. So, the general challenge is to build a device which is as small as possible and which contains as much memory as possible.

Therefore, for DRAM devices, it is desirable to store as much charge as possible using the smallest device geometry possible. A device which relies solely on parasitic capacitance (which is the ability of a transistor gate to store charge itself, without a separate storage capacitor) cannot store a great amount of charge. Therefore, it is desirable to provide increased capacitance for a given cell. A typical cell of an embedded DRAM device may consist of three transistor devices and a storage node capacitor. The size of the charge storage node of a capacitor in an embedded DRAM device becomes important because the charge storage capacity of a given capacitor is proportional to the size of the electrodes which form the capacitor.

The technology for producing DRAM devices is understood to be limited by the amount of charge which may be stored for a given size. It is desirable to have the storage node capacitor store as much charge as possible for a given amount of device surface area, and to store as much charge as possible per transistor, because the transistors and the capacitor compete for the same surface space within the memory cell that they combine to form. Thus, it is desirable to integrate as much capacitance as possible into the smallest, most highly integrated device cell as possible. One way to accomplish this is to use features of other components within the cell to form the charge-storing capacitor. This technique maximizes the integration of the cell. One conventional approach to achieve this technique is to integrate vertically by building capacitors on top of other components of the cell. A capacitor so built is called a stacked capacitor. Although the prior art provides a structure for a stacked capacitor, it does so at the expense of increased process complexity.

Storage capacitors exist in which one feature of the transistor components also serves as a portion of the capacitor or in which an interconnect layer between the components forms part of the capacitor. A cell with a stacked capacitor has a capacitor that is stacked above other components of the cell, in this particular case, over portions of the three transistors. Although the prior art structures may incorporate one feature of the existing transistor structure to form a part of a stacked capacitor, however, additional processing is required to complete the capacitor structure. As technology improvements allow for increasingly smaller device components and provide for higher degrees of integration, there is an increased challenge to incorporate other features of the transistors into the capacitor storage structure.

In the manufacture of semiconductor integrated circuit devices, it is also desirable to build a completed device using the fewest number of process operations. Fewer processing operations allows the devices to be built more quickly and less expensively, because each individual process operation requires raw materials and manpower to complete. Fewer process operations also reduce the number of devices lost due to contamination and reduce the chance for scrap due to misprocessing at a process operation. The use of fewer processing layers also provides benefits from a device perspective, in addition to the above advantages. The use of fewer layers or films decreases the risk of progressive misalignment of one device layer to another layer which is several layers removed. Fewer films used to make a device also results in fewer issues regarding the conformality of one film over another.

The manufacturing process for fabricating stacked capacitor devices typically involves fabricating the transistor components first. This involves introducing an impurity region into the semiconductor substrate, usually by a diffusion or ion implantation process, and also involves depositing and patterning of a semiconductor film to produce transistors. Then, following those operations, the stacked capacitors are fabricated physically on top of the previously formed transistors. A capacitor stores charge by the use of two electrodes. Capacitors in the existing art are comprised of electrodes made of semiconductor films added after the formation of the transistors. Thus, the capacitors are formed of semiconductor films other than the semiconductor film which forms the gates of the transistors. Although the stacked capacitor technology may involve the use of one or both of these electrodes as an interconnect material, the prior art does not involve using part of an impurity region of a functioning transistor to form one of the electrodes of the capacitor.

The deficiencies of the conventional stacked capacitor devices show that a need still exists for an improved device that provides both logic and memory circuitry on the same integrated circuit chip. To overcome the shortcomings of the conventional devices and methods of manufacturing those devices, a new stacked capacitor device is provided. An object of the present invention is to manufacture a device where the charge storing ability of the circuitry is maximized. As such, a related object is to build a device which is as small as possible and which contains as much memory as possible. Still another object of the present invention is to use features of other components within the cell to form the charge-storing capacitor. A further object is to build a completed device using the fewest number of process operations. A related object is to use fewer processing layers, thereby decreasing both the risk of progressive misalignment of one device layer to another layer and the number of issues regarding the conformality of one layer over another. An additional object is to manufacture a device that uses part of the functioning transistor component to form one of the electrodes of the capacitor.

SUMMARY OF INVENTION

To achieve these and other objects, and in view of its purposes, the present invention provides an improvement to the stacked capacitor technology existing in the current art. The improvement consists of adding a capacitor to a DRAM memory cell without adding process complexity. The same processes used to form and connect the memory transistors also form the capacitor. Specifically, the present invention involves the fabrication of a three device DRAM memory cell with a storage capacitor which is fabricated using only two layers of a deposited semiconductor film. A source/drain impurity region of one of the transistors, which is created within the main surface of the semiconductor substrate, forms one of the electrodes of the storage capacitor.

The first deposited semiconductor film forms the gates of the transistors. The second deposited semiconductor film connects a gate of one transistor with the source/drain impurity region of another and forms the other electrode of the capacitor. The second deposited semiconductor film may also connect the cell to other cells or devices within the integrated circuit. Thus, an additional semiconductor film to form one electrode, and the dielectric film to isolate this semiconductor film from the transistors below, are not required. Nor are the associated patterning or planarizing processes associated with these films required. The invention offers the advantages which result from an improved storage capacitance over cells which use only parasitic capacitance, and a reduced number of processing operations compared to stacked capacitors.

The present invention also maximizes the degree of integration and the amount of charge stored both per substrate area (because the capacitor uses an existing transistor impurity region and requires less lateral area) and per associated transistor. The three transistors forming the cell may be integrated into a small surface area. The design maximizes the efficient use of cell space; the capacitor sits atop the source/drain region of one transistor and connects to the gate of another transistor.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 5A–5H are cross sections depicting the process sequence used to fabricate the device according to the present invention.

DETAILED DESCRIPTION OF THE INVENTION

The Three Transistor Dram Device with Capacitor

Figure 1:
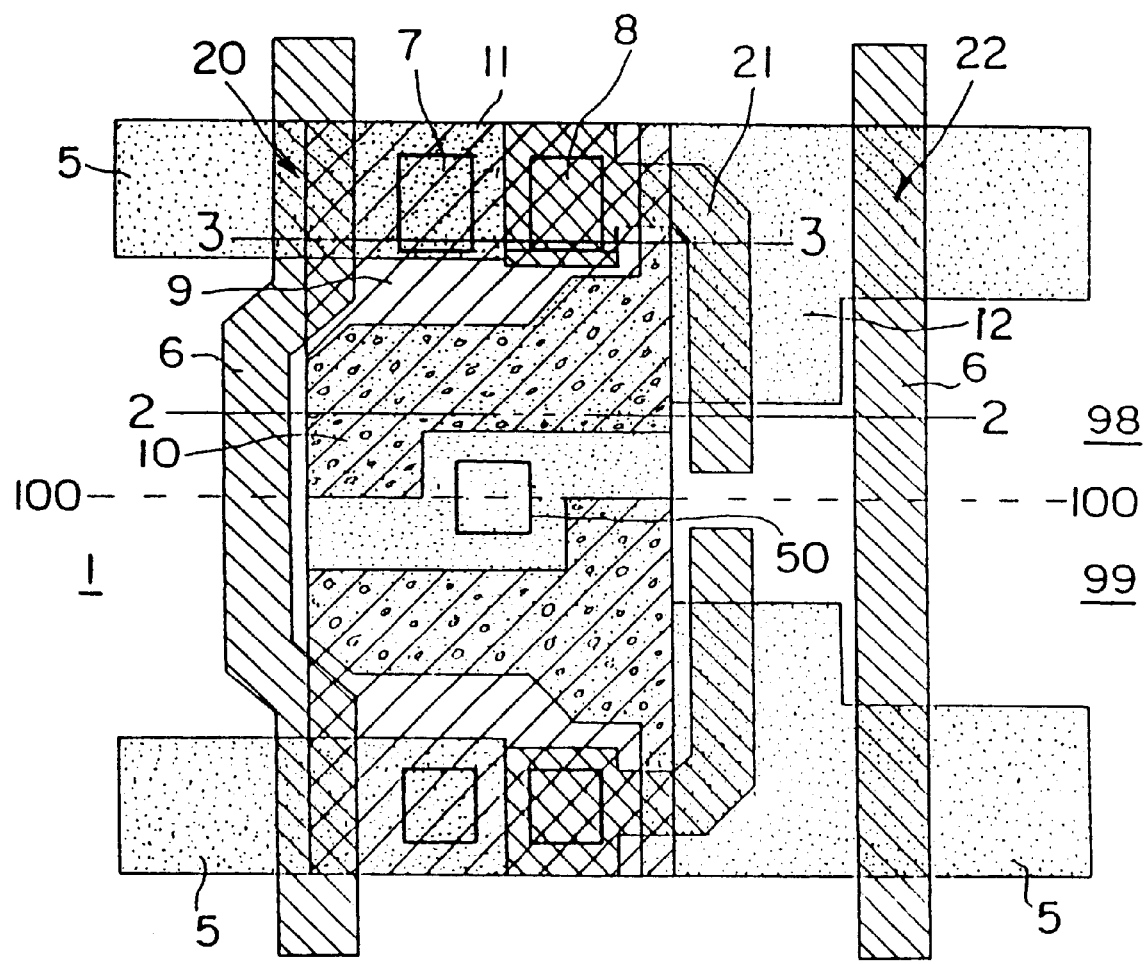
FIG. 1 is a top view showing two cells of an exemplary embodiment of the present invention, where each cell is a memory cell containing three transistors and the capacitor.

Referring now to the drawing, wherein like reference numerals refer to like elements throughout, FIG. 1 shows an exemplary embodiment of the top view of two DRAM cells, each cell containing three transistors and a storage node capacitor according to the present invention. The two cells 98 and 99 are separated by the dashed line 100—100. The metal wires used to connect this cell to other cells and semiconductor devices are omitted for clarity.

Transistors 20, 21, and 22 include source/drain regions formed within the impurity region 5 [indicated by shading] and gate regions formed of the first deposited semiconductor film layer 6 [indicated by upper left to lower right diagonal hatching] which is formed over a gate oxide film (not shown). The impurity region 5 is formed within the main surface 1 of the semiconductor substrate, and the source/drain regions are the regions within the impurity regions adjacent to the gates which form the capacitors. Contact 50 provides for the grounding of the impurity region 5.

By the first deposited semiconductor film layer 6, it is meant the semiconductor film which is deposited on the silicon substrate first during the manufacturing process. In the exemplary embodiment, this first deposited semiconductor film layer 6 may be polysilicon, and can be designated "poly-one." The channel region for each transistor is the region under the gate region which extends between the source and the drain regions and is the channel through which charge flows. As depicted, transistors 21 and 22 use a shared impurity area 12. The second deposited semiconductor film layer 9 [indicated by upper right to lower left diagonal hatching] forms a capacitor 10 in the region where the second semiconductor film layer 9 overlaps the impurity region 5 and where the films are separated only by a dielectric film (not shown). The capacitor 10 is indicated by the area filled with circular features.

In an exemplary embodiment, this second deposited semiconductor film layer 9 may be polysilicon, and can be designated "poly-two." The poly-two film layer 9 comprises the upper electrode of the capacitor 10, and the impurity region 5 makes up the lower electrode. In addition to forming the upper electrode of the storage capacitor, the poly-two film layer 9 connects the gate region of transistor is 21 with a source/drain impurity region 5 of transistor 20. Contact 7 provides for contact of the impurity source/drain region 5 of transistor 20 to the poly-two film layer 9. Contact 8 provides the connection of the poly-two film layer 9 to the section of the poly-one film layer 6 which comprises the gate region of transistor 21. In the preferred embodiment, the poly-two film layer 9 entirely covers an exposed section 11 of one of the source/drain impurity regions 5 of the transistor 20 to prevent silicide formation in the exposed section 11 during subsequent processing.

In an alternative embodiment not shown in FIG. 1, a borderless contact may be provided between transistors 21 and 22 for contacting impurity region 5 therebetween. The method for forming the buried contact and the buried contact structure produced, will be shown and discussed with respect to FIGS. 5A–5H.

Figure 2:
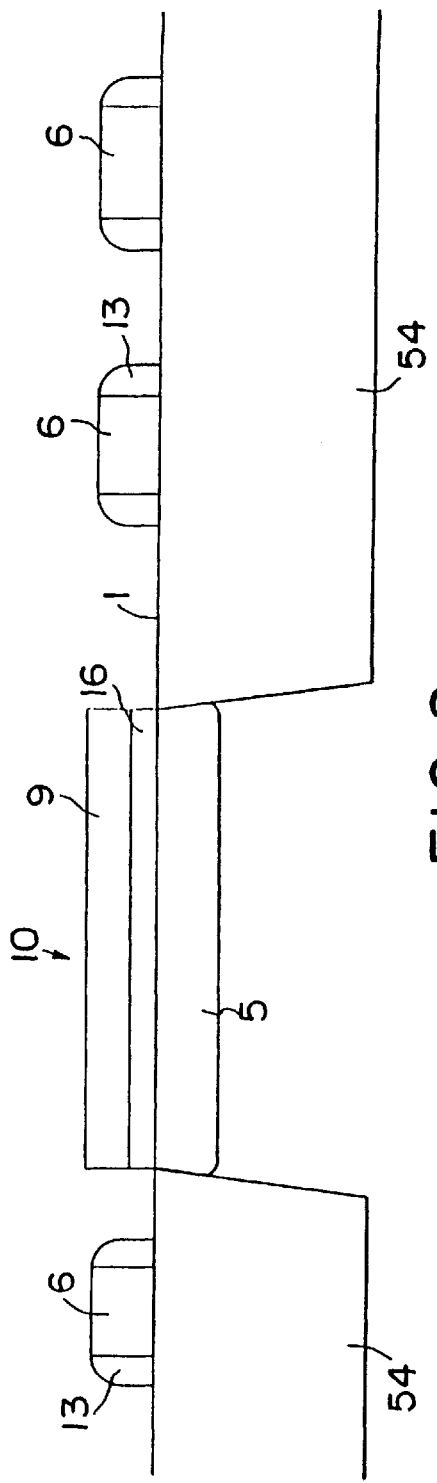
FIG. 2 is a cross section of the capacitor taken along line 2—2 of FIG. 1.
Figure 3:
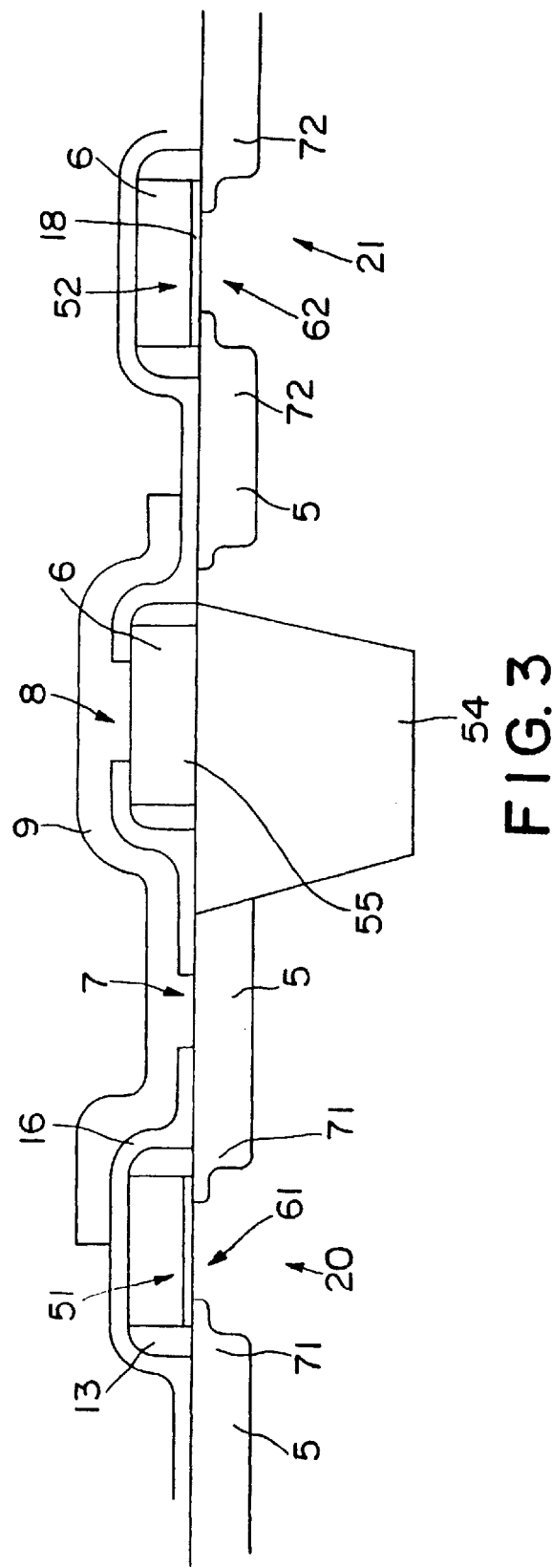
FIG. 3 is a cross section taken along line 3—3 of FIG. 1 showing the second semiconductor film providing a connection between the source/drain region of one transistor and the gate portion of a second transistor within the cell.

FIG. 2 is a cross-sectional view of the cell of FIG. 1, taken along the line 2—2 of FIG. 1. The capacitor 10 is formed of an upper electrode made of the poly-two film layer 9, and a lower electrode formed of the impurity region 5. A storage dielectric 16 lies between the two electrodes. The impurity region 5, which is formed within the main surface 1 of the semiconductor substrate, also extends (as shown in FIGS. 1 and 3) to form source/drain regions of the transistors. In addition to forming the upper electrode (as depicted) of capacitor 10, the poly-two film layer 9 also extends (as shown in FIGS. 1 and 3) to connect the source/drain impurity region of one transistor 20 to the gate region of a second transistor 21 within the DRAM cell. In the preferred embodiment, dielectric spacers 13 are formed alongside the patterned poly-one film layer 6.

FIG. 3 is a cross-sectional representation of another portion of the cell of FIG. 1, taken along line 3—3 of FIG. 1. FIG. 3 shows that transistors 20 and 21 include gate regions 51 and 52, respectively, channel regions 61 and 62, respectively, and source/drain regions 71 and 72, respectively, which are formed within the impurity region 5. The impurity region 5 is formed within the main surface 1 of the semiconductor substrate. Transistor 22, which shares source/drain impurity region 72 with transistor 21, is not shown. Poly-one lead section 55 forms one section of the same poly lead which also forms the gate region 52 of transistor 21, as depicted in FIG. 1 but not shown in FIG. 3.

Gate regions 51 and 52 are separated from channel regions 61 and 62 by a gate dielectric film 18. Shallow trench isolation region 54 isolates the impurity regions 5. The poly-two film layer 9 ultimately connects the gate region 52 of transistor 21 with the impurity region 5 which forms the source/drain region 71 of transistor 20. The gate region 52 of transistor 21 is part of the same poly lead which forms poly-one lead section 55 (this connection is as depicted in FIG. 1., but not shown in FIG. 3). Poly-one lead section 55 is connected to poly-two film 9 through contact 8. Poly-two film 9 makes contact, through contact 7, to impurity region 5, which forms the source/drain region 71 of transistor 20. In this manner, gate region 52 is ultimately connected to impurity region 5.

Figure 4:
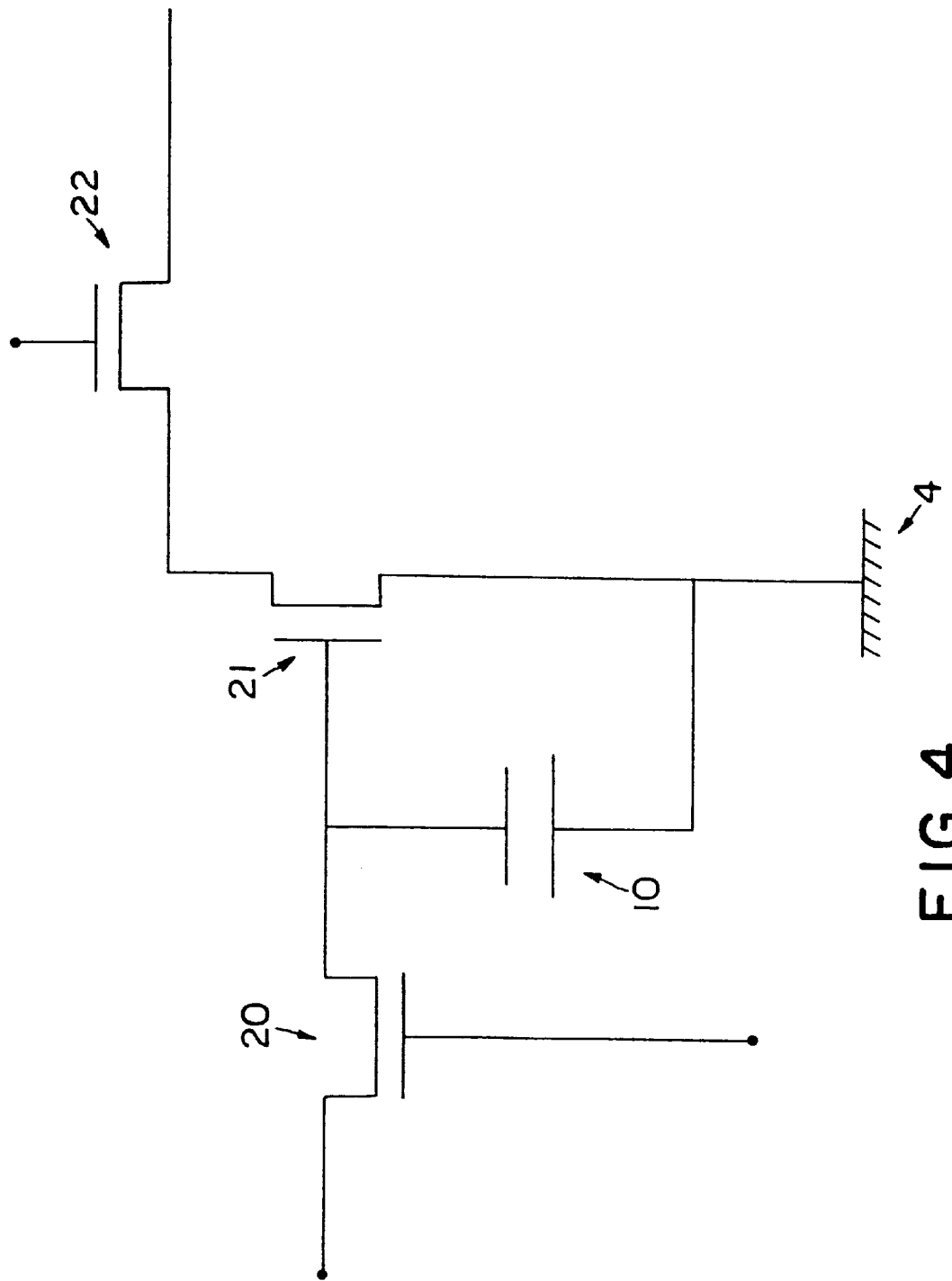
FIG. 4 is a wiring diagram of the cell containing three transistors and a capacitor.

FIG. 4 is the wiring diagram for the embodiment of the present invention discussed above and illustrates the electrical connection between transistors 20, 21, and 22 and capacitor 10, and the connection of the cell to ground 4.

Process of Manufacture

Figure 5C:
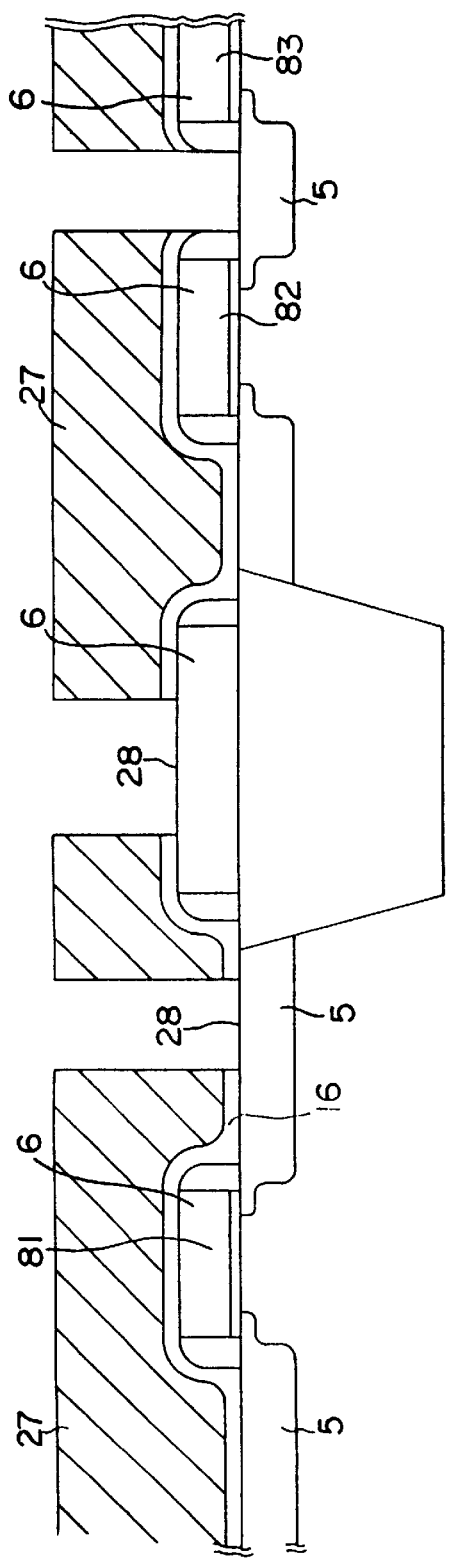

FIGS. 5A–5H are a series of cross-sections depicting the process used to manufacture the capacitor within the three transistor DRAM cell according to the present invention. The transistors may be complementary metal-oxide-semiconductor (CMOS) transistors in a preferred embodiment. FIG. 5A shows a three transistor cell before the addition of the capacitor or an interconnecting film. N+ impurity regions 5 are formed within the main surface 1 of the semiconductor substrate. The first deposited semiconductor film layer 6 is patterned, at a typical thickness of about 2,000–6,000 Å, to form the transistors. Transistors 20, 21, and 22 consist of gate regions 81, 82, and 83, respectively, formed of the first semiconductor film layer 6 over channel regions 23, 24, and 25, respectively. Gate dielectric 18 (having an approximate thickness in the range of 30–200 Å) separates the semiconductor film gate regions 81, 82, and 83 from the channel regions 23, 24, and 25, respectively. Dielectric spacers 13 appear on the sides of the patterned semiconductor film. In the preferred embodiment, this semiconductor film may be a polysilicon film, and can be designated "poly-one," as the first polysilicon film deposited in the process sequence. Shallow trench isolation region 54 (thickness of about 1,000–5,000 Å) isolates the impurity regions 5.

FIG. 5B represents the following process operation in the manufacturing process for the device according to the present invention. A dielectric film 16 is deposited over the existing device structure at a thickness of about 40–150 Å. The dielectric film 16 will later form the storage dielectric for the capacitor. The dielectric film 16 includes an upper surface 17.

FIG. 5C shows the pattern of contact openings 28 produced in the dielectric film 16 to provide for contact to both impurity regions 5 and to gate regions 81, 82, and 83 of poly-one film layer 6. A photoresist film 27 may be applied and patterned, and dielectric film 16 is removed in the exposed areas to create a pattern substantially identical to the pattern in the photoresist. Preferably, the removal of the exposed areas of the dielectric film 16 is accomplished by etching. The dielectric film 16 is etched down to expose the underlying impurity region 5 or poly-one film layer 6. After patterning of the dielectric film 16 is complete, the photoresist film 27 is removed (not shown).

Figure 5D:
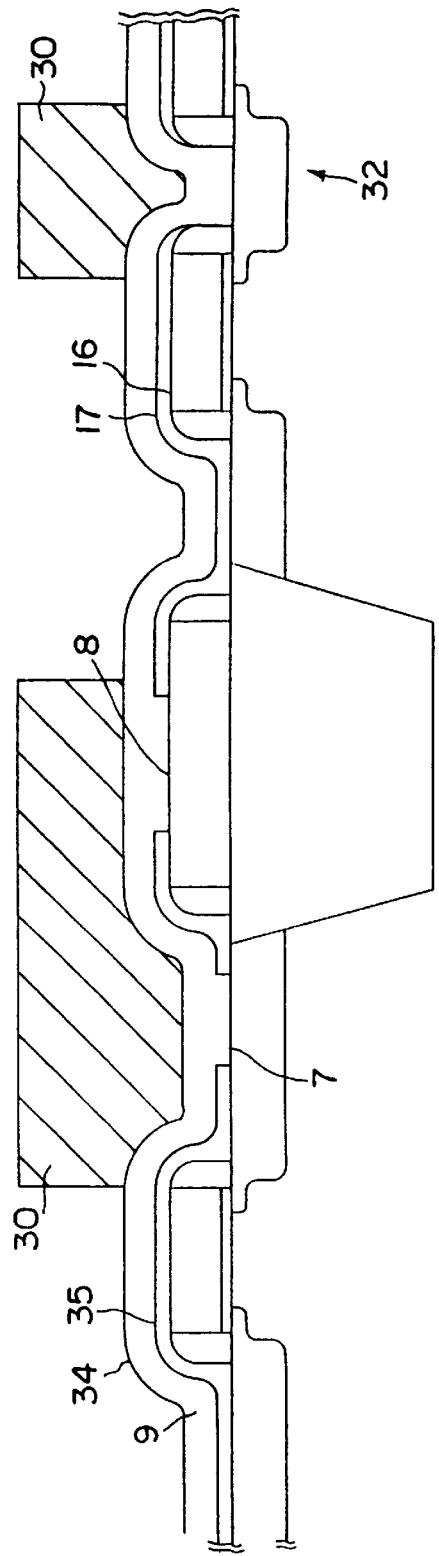

Now referring to FIG. 5D, a second deposited semiconductor film layer 9 is deposited on the upper surface 17 of the storage dielectric film 16. This second semiconductor film layer 9 will form the upper electrode of the capacitor, and will also connect the gate of one transistor to the source/drain impurity region of a second transistor. In a preferred embodiment, the second semiconductor film layer 9 may be polysilicon and, as the semiconductor film deposited second in the process sequence, is designated "poly-two." The poly-two film layer 9 contains an upper surface 34 and a lower surface 35. In an alternate embodiment, the poly-two film layer 9 may also be doped with an impurity (not shown) to improve device operation characteristics.

A patterning film 30, preferably photoresist, is used to create a pattern in this poly-two film layer 9. A pattern is first produced in the photoresist film. The exposed area of the poly-two film layer 9 may be etched, creating a pattern in the poly-two film layer 9 identical to the pattern created in the photoresist, as shown in FIG. 5E. The etch chemistry may be chosen so that there is minimal overetch into the dielectric film 16, below, and no undercut of the dielectric region under the poly-two film layer 9. Dielectric film 16 is then etched with the photoresist in place. After etching is complete, the photoresist film is removed (not shown). FIG. 5E also depicts structure 32 which will later provide for a "borderless" contact.

FIG. 5F shows the patterned poly-two film layer 9 after the photoresist and the storage dielectric film 16 have been removed to expose the underlying device structure. Transistors 20, 21, and 22 are included in the device cell and have gate regions 81, 82, and 83, respectively. The patterned poly-two film layer 9 is connected, through contact 7, to the impurity region 5 which forms a source/drain region of transistor 20. The patterned poly-two film layer 9 also is connected, through contact 8, to the poly-one film layer 6. Thus, poly-two film layer 9 connects the impurity region 5 to the poly-one film layer 6.

The poly-one lead 57 extends out of the crosssectional plane to form the gate region 82 of transistor 21. FIG. 5F also illustrates the structure which will provide for a "borderless" contact 32 of a metal wire (not shown in FIG. 5F) to the impurity region 5 through a section of the poly-two film layer 9. The poly-two film layer 9 contacts the impurity region 5 through opening 67, and contains an overlap region 46 where the poly-two film layer 9 overhangs the gates formed in the poly-one film later 6. The poly-two film layer 9 provides a wider contact area 66 than that of the original area 65 of the contact opening 67 to the diffusion area.

In the preferred embodiment, dielectric spacers 40 may be produced along the poly-two film layer 9, as depicted in FIG. 5F(1). After the poly-two film layer 9 is pattered and the photoresist removed, an additional dielectric film (not shown) is deposited on the device on top of the existing dielectric film to form a dielectric "sandwich." In the areas immediately adjacent to the edges of the poly-two film layer 9, the vertical thickness of the dielectric film sandwich is at a maximum. An additional pattern is not required. Next, the dielectric film sandwich is etched, unpatterned, using a largely anisotropic etch process. The etch process is timed to remove the bulk areas of the dielectric film completely, but to allow dielectric spacers 40 to remain alongside the etched poly-two film layer 9 because of the increased thickness of the dielectric sandwich at this region. In this preferred embodiment, the dielectric spacers 40 extend substantially up to the top surface 34 of the poly-two film layer 9.

After the exposed dielectric film is removed, except for the dielectric spacers 40 created alongside the etched poly-two film layer 9, a refractory metal film 75 is deposited on the entire top surface of the wafer, including the poly-two film layer 9. See FIG. 5G. The refractory metal film 75 is deposited after the dielectric spacers are created and the bulk dielectric film removed. A subsequent heat treatment process is then performed to form a silicide.

FIG. 5H shows a silicide film 76 formed in regions where the silicon substrate or the poly-one or poly-two film layers are exposed to the refractory metal (film 75 as shown in FIG. 5G). The refractory metal film combines with the exposed silicon or polysilicon film during the heat treatment to form the silicide film 76. FIG. 5H also shows dielectric film 43 deposited on top of the device structure and metallized contacts 44 provided. Borderless contact 32 is shown where the metallized contacts 44 connect to the poly-two film layer 9, which further connects to the underlying diffusion region 5 through contact opening 67. The poly-two film layer 9 forms a segment including overlap regions 46 where the poly-two film layer 9 overhangs the gates formed by the poly-one film layer 6. As depicted, the metallized contacts 44, which are connected to impurity region 5 through a smaller contact opening 67, do not require perfect alignment to the original contact opening 65. Imperfect alignment is possible because the poly-two film layer 9 increases the original contact area 65 to an enlarged contact area 66 through which the metallized contacts 44 may contact the impurity region 5 via the poly-two film layer 9 to provide for a borderless contact.

The foregoing description of preferred embodiments of the invention has been presented for the purposes of illustrating and describing the main points of the concepts of the invention. The present invention is not limited, however, to those embodiments. For example, alternate embodiments may include similar memory cells containing greater than three transistors in conjunction with the capacitor. The present invention positively uses an impurity region of the semiconductor substrate as an electrode for a storage node capacitor. It also uses the semiconductor film forming the upper electrode of the capacitor to connect a gate of one transistor to the source/drain region of another transistor. The present invention also describes the manufacturing process to produce these devices.

What is claimed:

1. In a memory cell having three devices and a capacitor for data storage, wherein the devices each comprise impurity regions formed within a substrate and a gate electrode formed by a first film, the improvement which comprises the capacitor including:

a first storage electrode comprised of a grounded impurity region of a first one of the devices; and a second storage electrode comprised of a first portion of a second film which extends contiguously to partially overlap a gate electrode of the first one of the devices and to connect said gate electrode of the first one of the devices to an impurity region of a second one of the devices.

2. The improvement of claim 1 wherein the impurity region of the second one of the devices has an exposed portion and the second storage electrode entirely covers the exposed portion.

3. The improvement of claim 1 wherein:

said first film is comprised of a first polysilicon layer which is the first polysilicon layer deposited during fibrication of the memory cell; and said second film is comprised of a second polysilicon layer which is the second polysilicon layer deposited during fabrication of the memory cell.

4. The improvement of claim 3 wherein a second portion of said second film provides means for connecting said memory cell to at least one further device.

5. The improvement of claim 3 wherein, a second portion of said second film provides a borderless contact to one of the impurity regions with respect to one of the gates.

6. The improvement of claim 3, wherein the second polysilicon layer is doped with an impurity.

7. The improvement of claim 1 wherein a second portion of said second film further extends to contact one of the impurity regions with respect to one of the gates, by means of a borderless contact.

8. A memory cell within a semiconductor integrated circuit, said memory cell comprising:

three devices each having impurity regions and a gate, a capacitor having a set of electrodes for data storage, a first of said set of electrodes comprised of one of said impurity regions of one of said devices, a first semiconductor layer forming the gates of the three devices, and a part of a second semiconductor layer forming the second of said set of electrodes and further extending contiguously to connect a gate of a first one of the devices to an impurity region of a second one of the devices, wherein said part of a second semiconductor layer partially overlaps said gate of a first one of the devices.

9. The memory cell as recited in clam 8, wherein another part of said second semiconductor layer fiter provides interconnect means to further devices of said integrated circuit.

10. The memory cell as in claim 9, wherein each of said semiconductor layers is polysilicon.

11. A semiconductor integrated circuit comprising:
   a) a semiconductor substrate having a main surface;
   b) a first device including first and second impurity regions separated by a first channel region formed at said main surfaced and a first gate electrode layer formed by a first conductive layer over said first channel region and a portion of said first and second impurity regions;
   c) a second device including third and fourth impurity regions separated by a second channel region formed at said main surface and a second gate electrode layer formed by the first conductive layer over said second channel region and a portion of said third and fourth impurity regions;
   d) a third device including fifth and sixth impurity regions separated by a third channel region formed at said main sure and a third gate electrode layer formed by the first conductive layer over said third channel region and a portion of said fifth and sixth impurity regions, the three devices connected to form a dynamic random access memory cell; and
   e) a capacitor with a first and second storage electrodes and a dielectric film therebetween, said first storage electrode comprised of one of said impurity regions of said second device and said second storage electrode comprised of a second conducive layer which further extends contiguously to connect one of said impurity regions of said first device with said second gate electrode layer, wherein said second conductive layer partially overlaps said second gate electrode layer.

12. The semiconductor integrated circuit device of claim 11 wherein said one of said impurity region of said first device has an exposed portion and the second storage electrode entirely covers the exposed portion.

13. The semiconductor integrated circuit of claim 11, wherein:
   said first conductive layer is comprised of a first polysilicon layer which is the first polysilicon layer deposited during fabrication of the memory cell; and
   said second conductive layer is comprised of a first position of a second polysilicon layer which is the second polysilicon layer deposited during fabrication of the memory cell.

14. The semiconductor integrated circuit of claim 13, wherein a second position of the second polysilicon layer further extends to contact one of the impurity regions with respect to one of the gates by means of a bordless contact.

15. The semiconductor integrated circuit of claim 13, wherein the second polysilicon layer is doped with an impurity.

16. A semiconductor dynamic random access memory device comprising:
   a) a semiconductor substrate having a main surface;
   b) a first transistor including first and second impurity regions separated by a first channel region formed at said main surface and a first gate electrode layer formed by a first conductive film over said first channel region and a portion of said first and second impurity regions, said first impurity region forming a first source region and said second impurity region forming a first drain region;
   c) a second transistor including third and fourth impurity regions separated by a second channel region formed at said main surface and a second gate electrode layer formed by the first conductive film over said second channel region and a portion of said third and fourth impurity regions, said third impurity region forming a second source region and said fourth impurity region forming a second drain region;
   d) a third transistor including fifth and sixth impurity regions separated by a third channel region formed at said main surface and a third gate electrode layer formed by the first conductive film over said third channel region and a portion of said fifth and sixth impurity regions, said fifth impurity region forming a third source region and said sixth impurity region forming a third drain region, the three transistors connected; and
   e) a storage node capacitor having an upper electrode and a lower electrode wherein said lower electrode is comprised of one of said first source and first drain regions, and the upper electrode is comprised of a second conductive film which further extends contiguously to connect said first gate electrode to one of said impurity regions of said second transistor and entirely covers said one of said impurity region of said second transistor to prevent silicide formation of said one of said impurity region of said second transistor, and said second conductive layer partially overlaps said first gate electrode.

* * * * *